Feb. 19, 1952 A. STIGTER 2,586,576

WIRELESS RECEIVER TUNABLE TO A NUMBER OF WAVE LENGTH RANGES

Filed May 7, 1948

INVENTOR.
ALBERT STIGTER
BY
Fred M. Vogel
AGENT

Patented Feb. 19, 1952

2,586,576

UNITED STATES PATENT OFFICE 2,586,576

WIRELESS RECEIVER TUNABLE TO A NUMBER OF WAVE LENGTH RANGES

Albert Stigter, Eindhoven, Netherlands, assignor to Hartford National Bank and Trust Company, Hartford, Conn., as trustee Application May 7, 1948, Serial No. 25,698
In the Netherlands June 14, 1947

5 Claims. (Cl. 250—20)

This invention relates to radio receiving sets which are tunable to a number of wavelength ranges. Such sets are, as a rule, provided with a change-over device by means of which the inductances of the various tunable oscillatory circuits may be substituted by others, the continuous tuning in the various ranges being effected by means of the same variable condensers, and the highest and the lowest frequency of each wavelength range being determined by the minimum and maximum values of the total capacities of the oscillatory circuits. It would be most desirable to have an optimum ratio between the said frequencies for each range, but a limit is set to this ratio, since the minimum capacity resulting from the inevitable stray capacities of each circuit which are substantially constituted by the capacities between the electrodes of the tube and their connecting wires and by the capacities between the conductive parts of the wavelength switch cannot be reduced below a certain value. Although it is possible to realise the tuning condensers with a great ratio between maximum and minimum capacities, the stray capacities are nevertheless so high that in the most favourable conditions the ratio of 1:3.5 between the lowest and highest tuning frequencies of a circuit is obtainable. The said stray capacities have particularly high values in circuits serving as couplings between two high-frequency amplifying stages or between a high-frequency amplifying stage and a mixing stage, on account of the large number of electrodes and their connecting wires and the large number of switching contacts then required. The said ratio is in this case even smaller.

The maximum ratio between the highest and lowest tuning frequencies obtainable for a tuning range is too small for the reception of frequencies in the short-wave region which is comprised between 6 megacycles/sec. and about 23 megacycles/sec. Subdivision of this region by changing-over the inductances of the tuning circuits does not provide a solution of this problem which is susceptible of practical use. The invention provides a device which permits, with little additional expense, of receiving all frequencies in such a wide region without any need of changing-over the inductances of the circuits.

The invention consists in that in a radio receiving set which is tunable to a number of wavelength ranges and which comprises at least one oscillatory circuit particularly serving for the reception of frequencies of the short-wave region and tunable to a high-frequency oscillation to be received or to an oscillation locally produced, which circuit comprises inter alia a fixed inductance and a variable condenser connected in parallel and which is included between two input and/or output electrodes of an amplifying or mixing tube, provision is made of a switching member which permits of connecting a fixed or semi-fixed condenser in series with the inductance of the circuit in such manner that the total minimum capacity of the circuit is materially reduced and the apparatus is rendered suitable for the reception of a higher frequency region.

The various elements of the apparatus may readily be proportioned in such manner that if, for example in the normal position of the switch, the range from 16 to 18 mc./s. can be received, after switching into circuit the said series condenser, the apparatus is suitable for the reception of the frequency range comprised between 18 and about 23 mc./s.

If no further steps are taken, the receiving apparatus thus built up has the disadvantage that, if the tunable circuit is connected between two input electrodes of an amplifying tube or of a mixing tube, the effective high-frequency signal voltage active between the said electrodes varies to a high extent with the tuning frequency in such manner that this voltage decreases according as the tuned frequency is lower. According to the invention, this disadvantage is obviated in that, by means of the said switching member, a fixed or semi-fixed condenser is, in addition, connected in series with the tuning condenser. Suitable proportioning of the various condensers may ensure that, after changing-over the said region of from 18 to about 23 mc./s. may readily be covered by variation of the tuning condenser, and that the signal voltage active in the input circuit of the high-frequency amplifying tube is substantially independent of tuning.

The invention will now be described more fully with reference to the accompanying drawing, in which.

The circuit diagram comprises various switches, the positions of which are such that the various aforesaid condensers are switched into circuit and consequently, assuming that the circuit-arrangement is intended for the reception of the said short-wave band comprised between 6 and 23 mc./s., the apparatus is adapted for the reception of the frequencies of this region exceeding 18 mc./s. All those parts which are not strictly necessary to clear understanding of the invention are omitted from the figures such for example as elements intended to change-over to the medium-wave or to the long-wave region. In the description following hereinafter it will first be assumed that the various switches, each of which may occupy one of two positions are in the position (not shown) in which the receiver is adapted for the reception of, for example, the wavelength range of from 6 to 18 mc./s. The apparatus then operates as an ordinary type superheterodyne receiver comprising a single high-frequency pre-amplifying stage.

Figure 1:
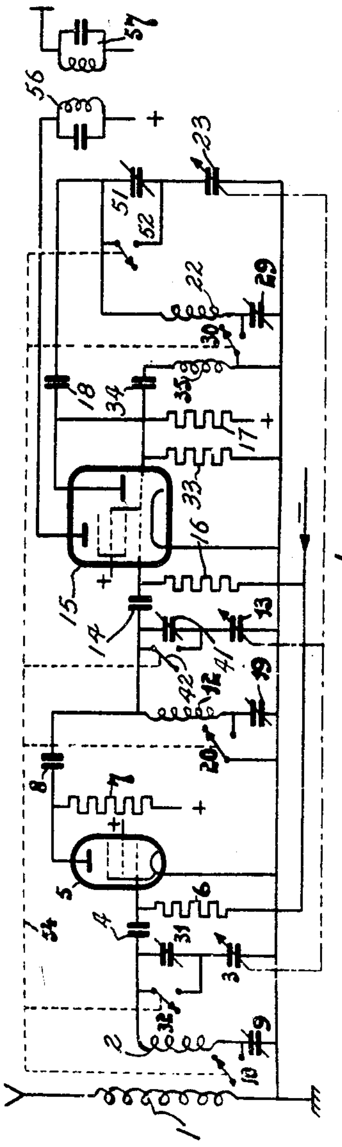
Fig. 1 shows a circuit arrangement according to the invention.

Referring to Fig. 1, reference numeral 1 designates the aerial circuit, which is inductively coupled with a coil 2 of the input circuit of a high-frequency amplifying tube 5, which is tunable to the incoming frequency by means of a variable condenser 3. The said circuit is connected across a condenser 4 to the control-grid of the tube and, on the other hand, like the cathode of the tube 5, it is earthed. The control-grid of the amplifying tube 5 may be supplied via a resistance 6 with a voltage for the automatic gain control of the tube.

The anode of the tube 5 is connected through a resistance 7 to the positive terminal of a supply voltage source. The anode is furthermore connected through a condenser 8 to the inductance 12, which forms part of the oscillatory input circuit of the hexode part of a triode-hexode tube 15, used as a mixing tube, which circuit is tunable to the signal frequency by means of a variable condenser 13. For this purpose the top end of the circuit 12, 13 is connected, through a condenser 14, to the first grid of the hexode part of tube 15, whereas the lower end is connected to the cathode of tube 15 and is, in addition, earthed. The said first grid is furthermore connected, through a resistance 16, to a device (not shown) which supplies voltage for the automatic gain control. The anode of the hexode part of tube 15 is connected, through a circuit 56, which is tuned to the intermediate frequency, to the positive terminal of the supply source. The circuit 56 is coupled inductively with a circuit 57, also tuned to the intermediate frequency, and constitutes together with the latter an intermediate-frequency band-pass filter, the output voltage of which is, for example, supplied to a detector, if desired with the interposition of one or more intermediate-frequency amplifying stages. The local oscillations which are mixed with the incoming oscillations in the hexode part of tube 15 so as to produce an oscillation of intermediate-frequency, is generated in the triode portion of tube 15. For this purpose the anode of this portion is connected via a condenser 18 to an oscillatory circuit tuned to the local frequency and comprising an inductance 22 and a variable condenser 23 connected in parallel. The inductance 22 is inductively coupled with an inductance 35, which is connected via a condenser 34, between the grid and the cathode of the triode portion of tube 15. The said grid is connected to the third grid of the mixing portion of tube 15 and is furthermore connected, through a leak resistance 33, to the cathode.

The circuit-arrangement so far described is that of an ordinary type superheterodyne receiver comprising a preamplifying stage. However, it has been found to be difficult to build up the circuits, and more particularly the intermediate circuit 12, 13, so as to permit the entire short-wave region of from 6 to 23 mc./s. to be used without commutation. The means provided according to the invention to mitigate this disadvantage will be described hereinafter.

According to the invention, in the first place provision is made of switches 10, 20, and 30, which, if they occupy the closed positions, i. e. the positions not shown in the figures, short-circuit the condensers 9, 19 and 29 connected in series with the inductances 2, 12 and 13. However, if the said switches are brought into the positions shown, the said condensers are connected in series with the associated inductances, with the result that the minimum capacities of the circuits are reduced and the possibility is given to tune, by means of the condensers 3, 13 and 23, to frequencies exceeding the range of from 6 to 18 mc./s. According to the invention, the circuit-arrangement is even improved by providing switches 32, 42 and 52, which are coupled, as shown by the line 54, with the switches 10, 20 and 30 and with the aid of which condensers 31, 41 and 51 may be connected in series with the various tuning condensers.

Figure 2:
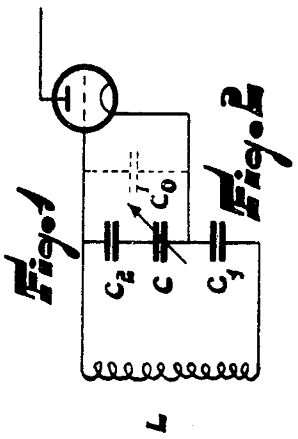
Fig. 2 shows an input circuit according to the invention.

The operation of the circuit-arrangement as described may be explained with reference to Fig. 2, which shows the input circuit of a high-frequency amplifying tube or a mixing tube in a simplified form. In this figure L designates an inductance and C a tuning condenser. The condenser connected in series with the inductance L is indicated by $C_1$ and the stray capacity of the circuit is indicated by $C_0$. The latter is present not only between the control-grid and the cathode of the amplifying tube, but also between the anode and the cathode of the preceding tube, between the various connecting wires and earth, and between the contacts of the change-over switch $C_2$ designates the condenser which, according to the invention, is provided to keep the strength of the transmission approximately constant throughout the region. It is obvious that the effect of $C_1$ is to reduce the total capacity of the circuit determining the tuning, so that the effect of the stray capacities is also reduced. Furthermore it is found that, if $C_2$ is not provided, only a small part of the voltage set up across the circuit will be active between the grid and the cathode when C occupies the position of maximum value, whereas at a small value of the capacity of C, the part of the voltage across the circuit which is active at the control-grid is considerably greater. The latter disadvantage is mitigated by the capacity $C_2$, which is supplied for each of the circuits by the condensers 31, 41 and 51. The value of the capacity of these condensers is not critical for the purpose in view; it is, however, desirable to realise these condensers, as the condensers 9, 19 and 29, in form of so-called trimming condensers; in this case they may be used for the relative matching of the capacities of the various circuits.

In an embodiment, given by way of example, the variation range of the tuning condenser for the high-frequency circuits was 10–500 pFs., the capacities $C_1$ and $C_2$ of the oscillator circuit being 80 pFs. each. The other circuits require values slightly divergent therefrom.

What I claim is:

1. A radio-receiver tunable to a plurality of bands of tuning frequencies, comprising an electron discharge tube having cathode, control and output electrodes, one of said electrodes being connected to ground potential at said tuning frequencies and another of said electrodes having a given fixed capacity relative to ground potential, tuning means comprising an inductive branch and a capacitative branch connected in parallel with each other and having one juncture thereof connected to ground potential at said tuning frequencies and the other juncture thereof coupled to said other electrode, said capacitive branch comprising a variable condenser and a first condenser connected in series with said variable condenser and said inductive branch comprising an inductive element and a second condenser connected in series with said inductive element, said first and second condensers having capacity values substantially smaller than the maximum capacity value of said variable condenser, and means to selectively short circuit said first and second condensers.

2. A radio-receiver tunable to a plurality of bands of tuning frequencies, comprising an electron discharge tube having cathode, control and output electrodes, one of said electrodes being connected to ground potential at said tuning frequencies and another of said electrodes having a given fixed capacity relative to ground potential, tuning means comprising an inductive branch and a capacitative branch connected in parallel with each other and having one juncture thereof connected to ground potential at said tuning frequencies and the other juncture thereof coupled to said other electrode, said capacitive branch comprising a variable condenser and a first condenser connected in series with said variable condenser and said inductive branch comprising an inductive element and a second condenser connected in series with said inductive element, said first and second condensers having substantially equal capacity values substantially smaller than the maximum capacity value of said variable condenser, and means to selectively short circuit said first and second condensers.

3. A radio-receiver tunable to a plurality of bands of tuning frequencies, comprising an electron discharge tube having cathode, control and output electrodes, one of said electrodes being connected to ground potential at said tuning frequencies and another of said electrodes having a given fixed capacity relative to ground potential, tuning means comprising an inductive branch and a capacitative branch connected in parallel with each other and having one juncture thereof connected to ground potential at said tuning frequencies and the other juncture thereof coupled to said other electrode, said capacitive branch comprising a variable condenser and a first condenser connected in series with said variable condenser and said inductive branch comprising an inductive element and a second condenser connected between said inductive element and ground potential at the said tuning frequencies, said first and second condensers having capacity values substantially smaller than the maximum capacity value of said variable condenser, and means to selectively short circuit said first and second condensers.

4. A radio-receiver tunable to a plurality of bands of tuning frequencies, comprising an electron discharge tube having cathode, control and output electrodes, one of said electrodes being connected to ground potential at said tuning frequencies and another of said electrodes having a given fixed capacity relative to ground potential, a first condenser, tuning means comprising an inductive branch and a capacitative branch connected in parallel with each other and having one juncture thereof connected to ground potential at said tuning frequencies and the other juncture thereof coupled by means of said first condenser to said other electrode, said capacitive branch comprising a variable condenser and a second condenser connected in series with said variable condenser and said inductive branch comprising an inductive element and a third condenser connected in series with said inductive element, said second and third condensers having capacity values substantially smaller than the maximum capacity value of said variable condenser, and means to selectively short circuit said second and third condensers.

5. A radio receiver tunable to a plurality of bands of tuning frequencies and having a plurality of stages including an amplifying and a mixing stage, each stage having an electron discharge tube with cathode, control and output electrodes, one of said electrodes being connected to ground potential at said tuning frequencies and another of said electrodes having a given fixed capacity relative to ground potential, means to couple two of said stages including a tunable circuit, comprising an inductive branch and a capacitative branch connected in parallel with each other and having one juncture thereof connected to ground potential at said tuning frequencies and the other juncture thereof coupled to the output electrode of one of said tubes and the control electrode of the succeeding tube, said capacitative branch comprising a variable condenser and a first condenser connected in series with said variable condenser and said inductive branch comprising an inductive element and a second condenser connected in series with said inductive element, said first and second condensers having capacity values substantially smaller than the maximum capacity value of said variable condenser, and means to selectively short circuit said first and second condensers.

ALBERT STIGTER.

REFERENCES CITED

The following references are of record in the file of this patent:

UNITED STATES PATENTS

| Number | Name | Date |
|---|---|---|
| 1,992,805 | Becker | Feb. 26, 1935 |
| 2,434,299 | Van Loon | Jan. 13, 1948 |
| 2,464,557 | Crockett | Mar. 15, 1949 |